United States Patent [19]

Hermann

[11] Patent Number: 4,594,643
[45] Date of Patent: Jun. 10, 1986

[54] DEVICE FOR FIXING A COOLING MEMBER ON THE COOLING SURFACE OF AN INTEGRATED MODULE

[75] Inventor: Adam Hermann, Munich, Fed. Rep. of Germany

[73] Assignee: Siemens Aktiengesellschaft, Berlin & Munich, Fed. Rep. of Germany

[21] Appl. No.: 650,659

[22] Filed: Sep. 14, 1984

[30] Foreign Application Priority Data

Sep. 29, 1983 [DE] Fed. Rep. of Germany ....... 3335332

[51] Int. Cl.⁴ .............................................. H05K 7/20
[52] U.S. Cl. .................................... 361/386; 165/185; 174/16 HS
[58] Field of Search ..................... 361/383, 386–389; 357/79, 81; 165/80 B, 185; 174/16 HS

[56] References Cited

U.S. PATENT DOCUMENTS 3,523,215  8/1970  Steinmentz, Jr. ................... 361/388
4,435,724  3/1984  Ralstin ................................ 357/79
4,481,525 11/1984  Calabro ........................ 174/16 HS

FOREIGN PATENT DOCUMENTS 2425723 12/1975 Fed. Rep. of Germany .
0034282  8/1981 Fed. Rep. of Germany .
3203609  8/1983 Fed. Rep. of Germany .

OTHER PUBLICATIONS

IBM Tech Discl Bull, vol. 23, No. 12, May 1981, pp. 5-303, Spring-Clip Mounted—Sink, Almquist et al.

Primary Examiner—G. P. Tolin
Attorney, Agent, or Firm—Hill, Van Santen, Steadman & Simpson

[57] ABSTRACT

A device for fixing a cooling member on the cooling surface of an integrated module, the cooling member having a base plate with several cooling fins disposed on opposite sides of a central core, has an insulating frame with two supporting yokes which rest against the free sides of the central core of the cooling member, each supporting yoke having two resilient legs which can be spread apart outwardly, the free ends of the legs being connected by a first cross bar and a second cross bar. The first cross bar is resiliently forced by said legs against the upper side of the base plate of the cooling member, and the second cross bar, which is provided with detent elements, is resiliently clamped in place surrounding a portion of the integrated module.

10 Claims, 5 Drawing Figures

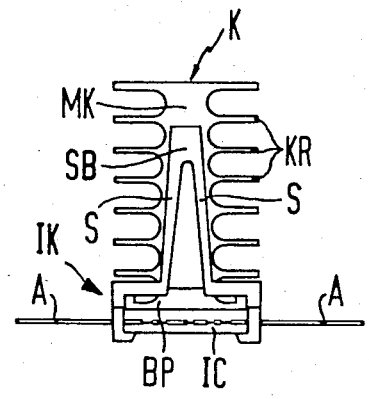
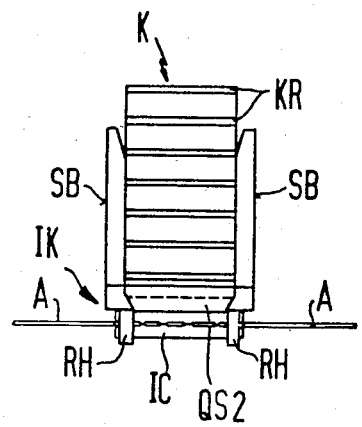
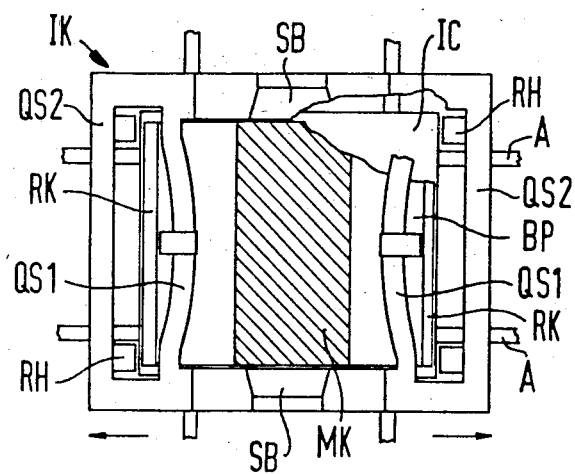

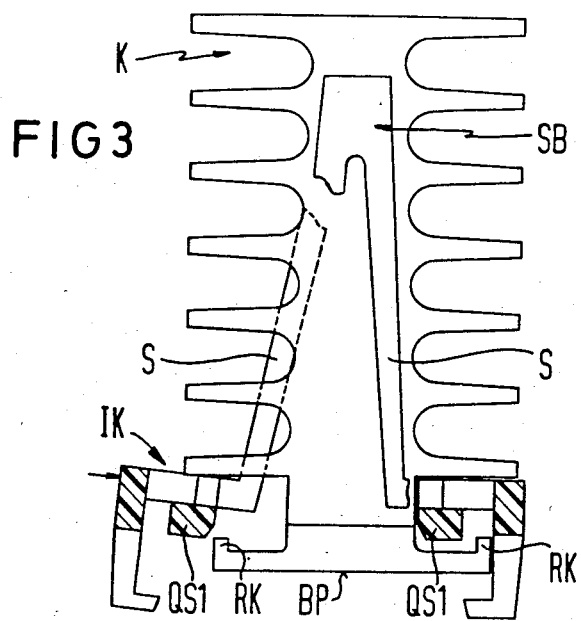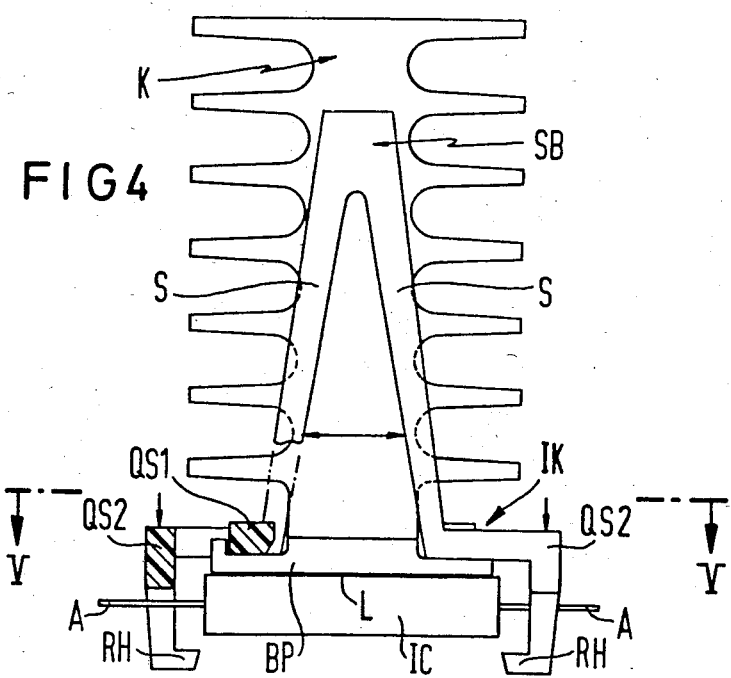

DEVICE FOR FIXING A COOLING MEMBER ON THE COOLING SURFACE OF AN INTEGRATED MODULE

BACKGROUND OF THE INVENTION

1. Field Of The Invention

The present invention relates to devices for attaching a cooling member to the cooling surface of an integrated module.

2. Prior Art

Various devices and methods for mounting cooling members on individual semiconductor components are known in the art. Once such method consists of fastening the cooling member to the semiconductor module with screws. Another method makes use of a resilient design of the cooling member so as to permit the cooling member to be clamped in place on the module. Such methods and structure are not suited for mounting cooling members on integrated circuit modules, in particular integrated circuit modules have a plurality of terminal pins arranged on the lateral surfaces of the integrated module. A known method for attaching cooling members to such integrated modules employs an adhesive to directly cement the cooling member to the upper side of the integrated module. A disadvantage of this method is that the cooling member cannot be detached from the module without destruction thereof. Moreover, the possibility exists that the freshly cemented cooling member, during assembly work following attachment thereof, may slip or fall off because the cement layer has not yet sufficiently cured.

As stated above, it is known to detachably mount a cooling member on an integrated module by pressing the cooling member, with the aid of a spring clip, onto the integrated module from above. Spring clips of this type generally consist of spring steel sheet metal and thus present the possiblity of a short circuit. For this reason, safety requires that intermediate of layers of insulating material be disposed between the spring clip and the integrated module. This, however, has the disadvantage that assembly becomes correspondingly more expensive because of the increased material and time requirements. Additionally, conventional spring clips are designed so as to press fit onto the cooling member from above the integrated module, which adds to the total height of the assembly. Most installations have a specified component height which cannot be exceeded, therefor requiring the cooling member to be made correspondingly smaller, at the expense of cooling efficiency.

SUMMARY OF THE INVENTION

It is an object of the present invention to provide a device for attaching a cooling member to the cooling surface of an integrated module having a plurality of lateral terminal pins which is simple and space-saving. It is a further object of the present object to provide such a device which achieves reliable, insulated mounting of the cooling member on the integrated module.

A further object of the present invention is to provide such a device which permits the cooling member to be detachably mounted to the integrated module.

The above objects are inventively achieved in a device for use with a cooling member which has a base plate and a central core from which a plurality of cooling ribs or fins extend on opposite sides. The device has an insulating frame with two supporting yokes which rest against the free sides of the central core of the cooling member, that is, the sides having no fins or ribs extending therefrom. Each supporting yoke is comprised of two legs which are resilient so as to be able to be outwardly spread apart. Each leg has free ends, the free ends of the two legs being connected to each other by first and second cross bars. The first cross bars are resiliently forced by said legs against an upper surface of the base plate of the cooling member. The second cross bars, which carry detent hooks on the free ends thereof, surround the sides of the integrated module, the detents functioning to clamp the second cross bar, and thus the entire frame, to the module.

DESCRIPTION OF THE DRAWINGS

FIG. 1 is a front view of a device for fixing a cooling member on the cooling surface of an integrated module constructed in accordance with the principles of the present invention.

FIG. 2 is a side view of the device shown in FIG. 1.

FIG. 3 is an enlarged view of the device shown in FIG. 1, partly in section, showing a first step in the assembly of the device to the cooling module.

FIG. 4 is an enlarged view of the device shown in FIG. 1, partly in section, showing a second step in the assembly of the device to an integrated module.

FIG. 5 is a sectional view, partly fragmented, taken along line V—V of FIG. 4.

DESCRIPTION OF THE PREFERRED EMBODIMENTS

A device IK for attaching a cooling member K to an integrated module IC is shown in front and side views in FIGS. 1 and 2. The cooling member K has a central core MK disposed on a base plate BP and having a plurality of cooling ribs or fins KR extending from opposite sides thereof.

The device IK, comprised of resilient insulating material such as plastic is in the form of a frame having two upstanding spaced yokes SB which rest against the free sides of the core MK, that is, the sides of the core MK which do not have fins KR extending therefrom.

The integrated module IC has a plurality of terminal pins A extending laterally therefrom, and the lower portion of the device IK grasps the integrated module IC in a manner described in greater detail below at portions thereof which are free of terminal pins A. Each yoke SB has a pair of resilient legs S terminating at a bottom of the device IK in free ends which are respectively connected by two cross bars QS1 and QS2 (only cross bar QS2 being visible in FIG. 2). The second cross bars QS2 each carry detent elements or hooks RH which embrace the lateral surfaces of the integrated module IC in regions thereof which are free of terminals A, preferably at the corner regions. A thin layer L (shown in FIG. 4) of cement or a heat-conducting paste may be applied between the base plate BP of the cooling member K and the upper, heat disipating surface of the integrated module IC. The first and second cross bars QS1 and QS2 function as two retaining means for clamping the device K, the integrated module IC and the cooling member K together.

A first assembly step for the purpose of mounting the device IK to the cooling member K is shown in FIG. 3. The supporting yokes SB of the device IK are slipped from below over the free sides of the cooling member K, and the two resilient legs S of each of the supporting yokes SB, connected in approximately V-formation are spread outwardly to such an extent that the two first cross bars QS1 extend into the space between the base plate BP and the lower cooling rib, and become locked in place therein by the resilient return of the two legs S behind a detent edge RK of the base plate BP.

The second assembly step is shown in FIG. 4 by which the device IK is attached to the integrated module IC. The device K is pressed downwardly along the second cross bars QS2, again making use of the resilience of the first cross bars QS1. In addition, the two legs S of the supporting yokes SB are again spread apart to such an extent that the integrated module IC can be inserted from below. The legs S resiliently return to the V-position clamping the integrated module IC by means of detents or hooks RH carried at the respective free ends of the cross bars QS2. The clamping forces the base plate BP against the upper heat disipating surface of the integrated module IC. The detent hooks RH additionally function as spacers when the terminal pins A are angled downwardly and the integrated module IC is connected to a printed circuit board.

The second assembly step is shown in plan view in FIG. 5, the central core MK of the cooling member K being sectioned in the region between the base plate BP and the lowest cooling rib. The legs S of the two supporting yokes SB are shown in FIG. 5 spread apart, with the first cross bars QS1 being already locked in place behind the detent edge RK of the base plate BP. The second cross bars QS2 with the detent hooks RH are pressed downwardly at the exterior past the housing of the integrated module IC in order that the detent hooks RH, disposed laterally with respect to the terminal pins A, lock in place beneath the housing during the subsequent resilient return of the legs S. The arrangement of the detent hooks RH, moveover, is so selected such that the device IK can be mounted together with the cooling member K on the integrated module IC even in a commerical measuring and transport support mounting, wherein the hooks RH engage recesses in the mounting provided for this purpose.

The central core MK of the cooling member K may be conically formed or tapered such that its surface is substantially parallel to the V-formation of the legs S of the yokes SB.

Although modifications and changes may be suggested by those skilled in the art it is the intention of the inventor to embody within the patent warranted hereon all changes and modifications as reasonably and properly come within the scope of his contribution to the art.

I claim as my invention:

1. A device attaching a cooling member to an integrated module having a plurality of terminal pins extending laterally therefrom, said cooling member have a base plate with an upstanding central core having a plurality of cooling ribs extending from opposite sides thereof with free sides between said opposite sides, said device consisting of insulating material and comprising:
   a pair of upstanding spaced yokes receiving said central core of said cooling member therebetween and respectively resting against said free sides thereon, each yoke having two resilient legs with free ends;
   a pair of first cross bars connecting said free ends of said legs and being resiliently forced by said legs against an upper surface of said base plate; and
   a pair of second cross bars connecting said free ends of said legs and carrying detent elements thereon, said second cross bars surrounding a portion of said integrated module and said detent elements clamping said device, said integrated module and said cooling member together.

2. A device as claimed in claim 1 wherein said two resilient legs of each of said yokes are connected in a V-formation.

3. A device as claimed in claim 2 wherein said central core of said cooling member is tapered such that the surface of said central core is substantially parallel to said legs in said V-formation.

4. A device as claimed in claim 1 wherein said free ends of said legs are bent outwardly from said cooling member.

5. A device as claimed in claim 1 further comprising detent means disposed at opposite outer edges of said base plate of said cooling member, said detent means restraining said first cross bars thereagainst.

6. A device as claimed in claim 1 wherein each of said first cross bars has a limiting edge resiliently forced against said detent means by said legs.

7. A device as claimed in claim 1 wherein said detent elements carried on said second cross bars are in the form of hooks which extend around the lateral sides of said integrated module.

8. A device as claimed in claim 1 further comprising an adhesive layer disposed between said integrated module and said base plate of said cooling member.

9. A device as claimed in claim 1 further comprising a layer of heat-conducting material disposed between said integrated module and said base plate of said cooling member.

10. A device attaching a cooling member to an integrated module, said cooling member having a base plate disposed against said integrated module and an upstanding heat-disipating section connected thereto, said device comprising:
    a frame consisting of insulating material, said frame having a pair of upstanding, spaced, resilient cooling member receiving elements disposed on opposite sides of said cooling member, a pair of first resilient bracket means connected at a base of said cooling member receiving elements and resiliently forced by said cooling member receiving elements against said base plate of said cooling member, and a pair of second resilient bracket means also connected at said base of said cooling member receiving elements respectively surrounding a portion of said integrated module, said first and second bracket means in combination clamping said frame, said integrated module, and said cooling member together.

* * * * *